United States Patent [19]
Oae et al.

[11] Patent Number: 5,245,194
[45] Date of Patent: Sep. 14, 1993

[54] ELECTRON BEAM EXPOSURE SYSTEM HAVING AN ELECTROSTATIC DEFLECTOR WHEREIN AN ELECTROSTATIC CHARGE-UP IS ELIMINATED

[75] Inventors: Yoshihisa Oae; Hiroshi Yasuda, both of Kawasaki, Japan

[73] Assignee: Fujitsu Limited, Kanagawa, Japan

[21] Appl. No.: 872,194

[22] Filed: Apr. 22, 1992

[30] Foreign Application Priority Data

Apr. 26, 1991 [JP] Japan ................................. 3-097319

[51] Int. Cl.⁵ .......................................... H01V 29/74
[52] U.S. Cl. ............................... 250/492.2; 250/396 R
[58] Field of Search .......................... 250/396 R, 492.2

[56] References Cited

U.S. PATENT DOCUMENTS

4,639,602  1/1987  Henzler ..................... 250/396 R
4,704,532 11/1987  Hua ........................... 250/396 R

*Primary Examiner*—Jack I. Berman
*Attorney, Agent, or Firm*—Nikaido, Marmelstein, Murray & Oram

[57] ABSTRACT

An electron beam exposure system comprises an electron beam source for producing an electron beam, an electron lens system for focusing the electron beam on an object, and an electrostatic deflector supplied with a control signal for deflecting the electron beam in response to the control signal, wherein the electrostatic deflector comprises a sleeve extending in an axial direction and having an outer surface and a corresponding inner surface. A plurality of electrodes are provided on the outer surface of the sleeve with a separation from each other in a circumferential direction. The sleeve has a finite conductivity such that an electric current flows along the sleeve in the circumferential direction when a control voltage is applied across the plurality of electrodes.

10 Claims, 7 Drawing Sheets

ELECTRON BEAM EXPOSURE SYSTEM HAVING AN ELECTROSTATIC DEFLECTOR WHEREIN AN ELECTROSTATIC CHARGE-UP IS ELIMINATED

BACKGROUND OF THE INVENTION

The present invention relates in general to fabrication of semiconductor devices and in particular to an electron beam exposure system for writing a semiconductor pattern on a semiconductor substrate by an electron beam.

In the submicron patterning of semiconductor devices, the electron beam exposure system is suited. The electron beam exposure system uses a finely focused electron beam for writing a semiconductor pattern on a semiconductor substrate and can achieve the resolution of less than 1 $\mu$m without difficulty. On the other hand, the conventional electron beam exposure system has suffered from the problem of relatively low throughput because of the basic constraint of the system in that the semiconductor pattern is written in one stroke of the focused electron beam.

In order to improve the problem of low throughput, a technique of so-called block exposure is proposed. According to this procedure, the electron beam is shaped into one of fundamental patterns of semiconductor devices and a desired semiconductor pattern is written on the substrate as a consecutive repetition of "shots" of selected fundamental patterns. This block exposure technique is particularly suited for the fabrication of semiconductor devices such as memories in which a repetition of fundamental patterns is included.

In the block exposure process, the shaping of the electron beam is achieved by deflecting the electron beam to pass through apertures that are provided on a stencil mask. By addressing various apertures on the mask, one can shape the cross section of the electron beam according to the desired fundamental pattern. Conventionally, an electrostatic deflector is used for such a high speed deflection of the electron beam because of the extremely fast response. Such an electrostatic deflector is used also in various places of the electron beam exposure system.

Figure 1:
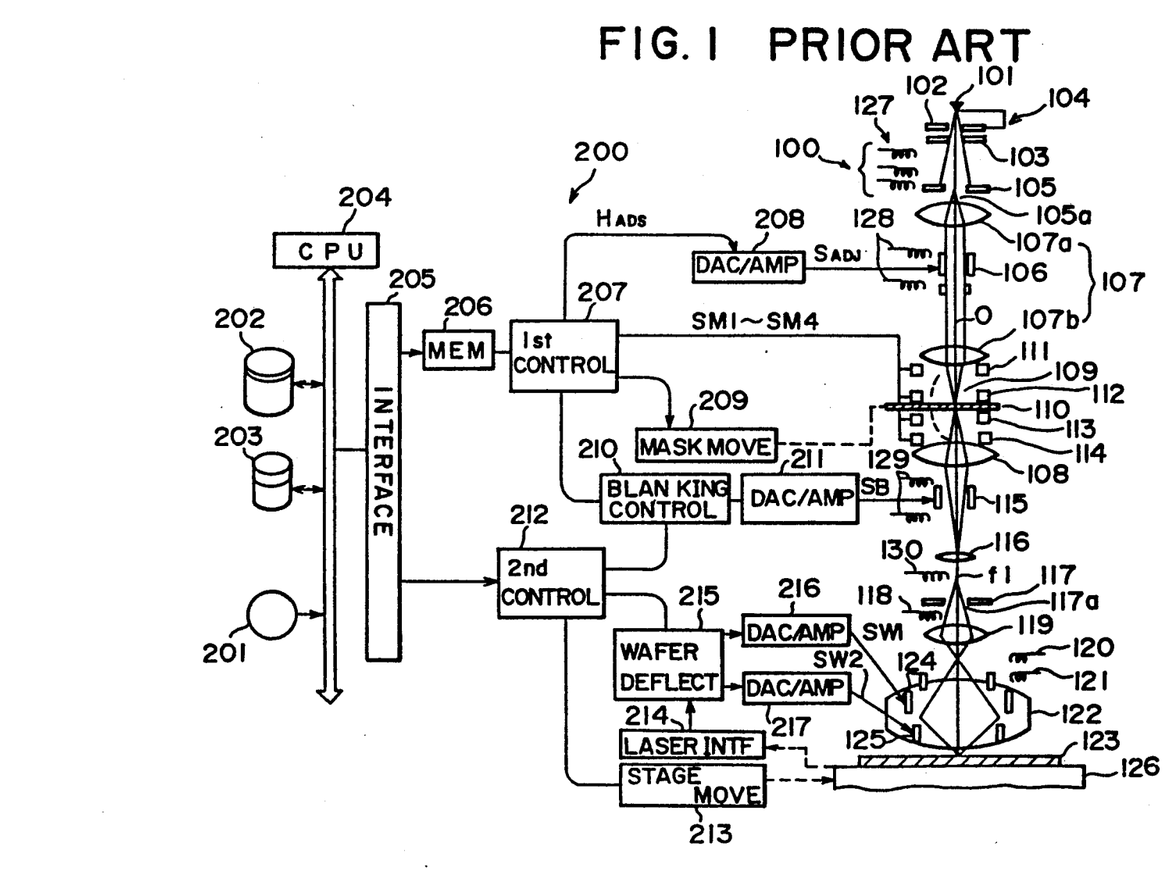
FIG. 1 is a diagram showing the overall construction of a conventional electron beam exposure system.

FIG. 1 shows the construction of a conventional electron beam exposure system that uses the technique of block exposure. Referring to the drawing, the electron beam exposure system is generally formed from an electron optical system 100 for producing and focusing an electron beam and a control system 200 for controlling the optical system 100.

The electron optical system 100 includes an electron gun 104 as a source of the electron beam. The electron gun 104 includes a cathode electrode 101, a grid electrode 102 and an anode electrode 103, and produces the electron beam generally in the direction of a predetermined optical axis 0 in the form of divergent beam.

The electron beam thus produced by the electron gun 104 is passed through a shaping aperture 105a formed in an aperture plate 105. The aperture plate 105 is provided such that the aperture 105a is in alignment with the optical axis O and shapes the incident electron beam to have a rectangular cross section.

Figure 2:
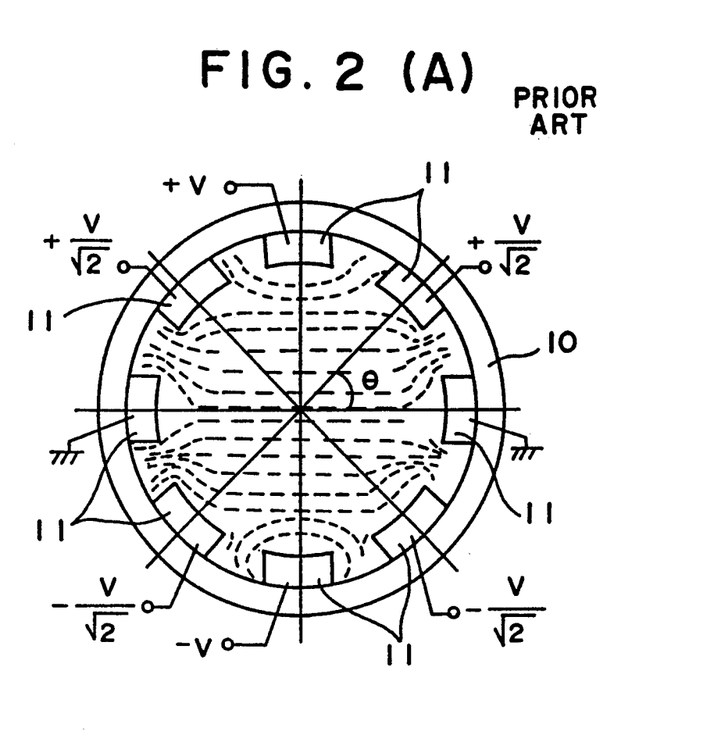
FIGS. 2(A) and 2(B) are diagrams showing examples of the electrostatic deflector used in the electron beam exposure system of FIG. 1 for deflecting an electron beam at a high speed.

The electron beam thus shaped is received by an electron lens 107a that has a focal point coincident to the aperture 105a. Thereby, the incident electron beam is converted to a parallel beam and enters into an electron lens 107b that focuses the electron beam on a block mask 110. It should be noted that the lens 107b projects the image of the rectangular aperture 105a on the block mask 110. As shown in FIG. 2, the block mask 110 carries a number of fundamental patterns 1a, 1b, 1c, . . . of the semiconductor device pattern to be written on the substrate in the form of apertures, and shapes the electron beam according to the shape of the aperture through which the electron beam has passed.

In order to deflect the electron beam passed through the electron lens 107b and address the desired aperture, electrostatic deflectors 111, 112, 113 and 114 are provided, wherein the electrostatic deflector 111 deflects the electron beam away from the optical axis O in response to a control signal SM1. The electrostatic deflector 112 in turn deflects back the electron beam generally in parallel to the optical axis O in response to a control signal SM2. After passing through the block mask 110, the electrostatic deflector 113 deflects the electron beam toward the optical axis O in response to a control signal SM3, and the electrostatic deflector 114 deflects the electron beam such that the electron beam travels coincident to the optical axis O in response to a control signal SM4. Further, the block mask 110 itself is provided movable in the direction perpendicular to the optical axis O for enabling the addressing of the apertures on the entire surface of the block mask 110 by the electron beam.

The electron beam thus passed through the block mask 110 is then focused at a point fl that is located on the optical axis O after passing through electron lenses 108 and 116. There, the image of the addressed aperture on the block mask 110 is demagnified at the point fl. The electron beam thus focused is then passed through a blanking aperture 117a formed in a blanking plate 117 and further focused on the surface of a substrate 123 that is held on a movable stage 126, after passing through electron lenses 119 and 122 that form another demagnifying optical system. There, the electron lens 122 serves for an objective lens and includes various coils such as correction coils 120 and 121 for focusing compensation and stig compensation as well as deflection coils 124 and 125 for moving the focused electron beam over the surface of the substrate 123.

It should be noted that the foregoing blanking aperture 117a is provided coincident to the optical axis O for establishing an alignment of the electron beam therewith. For this purpose, various adjustment coils 127–130 are provided. Thus, at the beginning of the exposure, the electron beam is turned on and the arrival of the electron beam at the stage 126 is detected while controlling the adjustment coils 127–130. During this procedure, the mask 110 may be removed from the optical path O for free passage of the electron beam. Alternatively, a large aperture formed in the mask 110 for passing the electron beam freely may be used.

In FIG. 1, it should be noted that the illustrated state represents the operational state of the electron beam exposure system wherein the electron beam is focused at the surface of the substrate 123. In this state, the focusing point fl of the optical system formed of the lenses 108 and 116 is located above the blanking aperture plate 117 for achieving the desired demagnification.

In order to control the exposure operation, the electron beam exposure system of FIG. 1 includes the control system 200, wherein the control system 200 includes memory devices such as a magnetic tape device 201 and magnetic disk devices 202, 203 that are provided to store various data of the device pattern of the semiconductor device to be written. In the illustrated example, the magnetic tape device 201 is used for storing various design parameters, the magnetic disk device 202 is used for storing the exposure pattern data, and the magnetic disk device 203 is used for storing the pattern of the apertures on the block mask 110.

The data stored in the memory devices is read out by a CPU 204 and transferred to an interface device 205 after data decompression. There, the data for specifying the pattern on the block mask 110 is extracted and stored in a data memory 206. The data stored in the data memory 206 is then transferred to a first control unit 207 that produces the foregoing control signals SM1–SM4 and supplies the same to the electrostatic deflectors 111–114. Further, the control unit 207 produces and supplies a control signal to a mask moving mechanism 209 that moves the block mask 110 in the direction transverse to the optical path O. In response to the deflection of the optical the electrostatic deflectors 111–114 and further in response to the lateral movement of the block mask 110, one can address the desired aperture on the mask 110 by the electron beam.

The first control unit 207 further supplies a control signal to a blanking control unit 210 that in turn produces a blanking signal for shutting off the electron beam. This blanking signal is then converted to an analog signal SB in a D/A converter 211 and the analog signal SB is supplied to an electrostatic deflector 115 that causes a deflection of the electron beam away from the optical axis O. In response to this, the electron beam misses the blanking aperture 117a and disappears from the surface of the substrate 123. Further, the control unit 207 produces a pattern correction data $H_{ADJ}$ and supplies the same to a D/A converter 208. The D/A converter 208 in turn produces a control signal $S_{ADJ}$ and supplies the same to an electrostatic deflector 106 that is provided between the electron lens 107a and the electron lens 107b. Thereby, one can modify the shape of the electron beam that have passed through the addressed aperture in the mask 110. This function is used when the desired shape of the electron beam is different from the shape given by the apertures on the block mask 110.

The interface device 205 further extracts and supplies the data for controlling the movement of the electron beam on the surface of the substrate 123 to a second control unit 212. In response thereto, the control unit 212 produces a control signal for controlling the deflection of the electron beam on the surface of the substrate 123 and supplies the same to a wafer deflection control unit 215 that in turn produces and supplies deflection control signals to D/A converters 216 and 217. The D/A converters 216 and 217 in turn produce drive signals SW1 and SW2 for driving the deflectors respectively and supply the same to the deflectors 124 and 125 for causing the deflection of the electron beam. Thereby, the position of the stage 126 is detected by a laser interferometer 214 and the wafer deflection control unit 215 modifies the output deflection control signals and hence the drive signals SW1 and SW2 according to the result of measurement of the stage position by the laser interferometer. Further, the second control unit 212 produces a control signal that causes a lateral movement of the stage 126.

FIG. 2(A) shows a conventional electrostatic deflector that is used in the electron beam exposure system of FIG. 1.

Referring to FIG. 2(A), the electrostatic deflector includes an insulating sleeve 10 of a ceramic material, and there are provided a number of elongated electrodes 11 along the inner surface of the sleeve 10 to extend in the longitudinal direction of the sleeve. In the cross sectional view of FIG. 2(A), the electrodes 11 are arranged symmetrically about a central axis of the sleeve. In operation, a positive voltage $+V$ and a negative voltage $-V$ are applied across the opposing electrodes to form an electric field inside the sleeve as indicated by the broken lines. Thereby, the electron beam that travels along the central axis of the sleeve 10 is deflected by the Lorentz force as is well know. Further, in order to realize a uniform distribution of the electric field inside the sleeve 10, the rest of the electrodes 11 are also applied with a voltage $V_i$ that changes with an angle $\theta$ according to the relationship $V_i = V \cdot \sin \theta$.

In the electrostatic deflector of FIG. 2(A), there exists a problem in that the electrons tend to be accumulated on the inner surface of the ceramic sleeve 10 when used for deflecting the electron beam. It should be noted that there exit various scattered electrons inside the evacuated column that accommodates the electron optical system of the electron beam exposure system, and the accumulation of such scattered electrons on the sleeve of the electrostatic deflector cannot be avoided. Such an accumulation of the electrons causes a charge-up of the electrostatic deflector, while such a charge-up of the electrostatic deflector causes in turn an unwanted deflection or deformation of the electron beam. This problem of charge-up is particularly serious when writing a semiconductor pattern with the submicron resolution. For example, the exposed pattern may be deformed or blurred.

The conventional electrostatic deflector of FIG. 2(A) has another problem in that the distribution of the potential inside the sleeve 10 becomes inevitably distorted particularly in the vicinity of the electrodes. It should be noted that there is no potential inside a conductor body. Thus, there occurs a problem in that the electric field formed inside the sleeve 10 becomes distorted significantly in the vicinity of the electrodes. In order to achieve a uniform electric field inside the sleeve 10, it is preferable to form the size of the electrode as small as possible, particularly in terms of the lateral width. On the other hand, the formation of such fine, strip-like electrodes on the inner surface of the sleeve 10 with a precision sufficient for the submicron patterning is extremely difficult.

FIG. 2(B) shows another example of the conventional electrostatic deflector wherein the problem of charge-up is eliminated.

Referring to FIG. 2(B), the electrostatic deflector includes an insulating sleeve 20 similar to the ceramic sleeve 10, wherein there is provided a conductor 20a such that the conductor 20a covers the inner surface of the sleeve 20. As indicated in FIG. 2(B), the conductor 20a is connected to the ground. Further, there are provided a plurality of electrodes 21 arranged generally symmetrical about the axis of the sleeve 10 along the inner surface of the conductor 20a but with a separation therefrom. There, the electrodes 21 extend in the axial direction of the sleeve 20. In the illustration of FIG. 2(B), the electrodes extend perpendicular to the sheet of the drawing.

In the electrostatic deflector of FIG. 2(B), the problem of the charge-up is successfully eliminated. On the other hand, the electrostatic deflector of FIG. 2(B) has a problem in that the fabrication thereof is extremely difficult, as the electrodes 21 have to be held exactly with a predetermined relationship with each other and further with respect to the conductor 20a. It should be noted that the inner diameter of the sleeve 20 is in the order of several millimeters. Further, the problem of the non-uniform distribution of the potential and hence the electric field is not solved in the device of FIG. 2(B).

Figure 3:
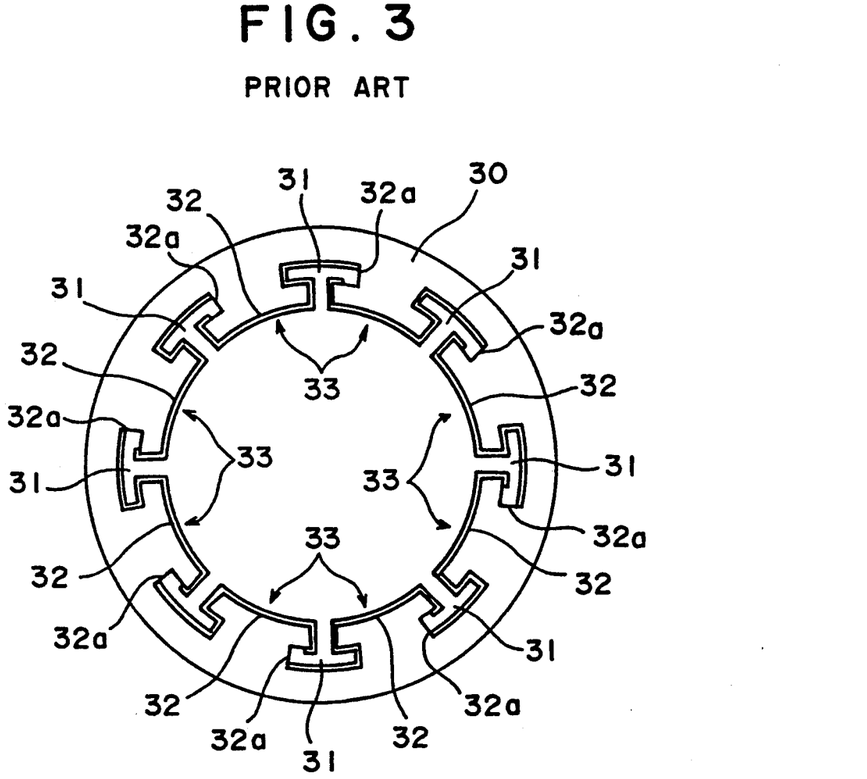
FIG. 3 is a diagram showing another example of the electrostatic deflector.

FIG. 3 shows another electrostatic deflector that also uses an insulating sleeve 30.

Referring to FIG. 3, the insulating sleeve 30 is formed with a number of grooves 31 on the inner surface thereof to extend in the axial direction of the sleeve. There, the grooves 31 have a T-shaped cross section and are disposed symmetrically about the central axis of the sleeve. Further, the inner surface of the sleeve 30 as well as the surface of the groove 31 are covered by a conductor film 32 except for a part 32a such that the conductor film 32 is divided into a number of separate electrodes 33. In the electrostatic deflector of FIG. 3, the entire inner surface of the sleeve 30 is covered by the conductor film 32, except for the part 32a, and the problem of the charge-up is eliminated almost completely. On the other hand, the electrostatic deflector still has the problem of non-uniform distribution of the potential because of the relatively large lateral extension of the electrode 33.

Further, the electrostatic deflector of FIG. 3 has another more practical problem in that the fabrication of the device is extremely difficult. Generally, the ceramic sleeve that has such a complex cross section is formed by the injection molding process or extrusion process. In such a forming process used commonly in the field of ceramic materials, it is generally impossible to obtain a smooth surface inside the grooves 31. It should be noted that the inner surface of the sleeve 30 is made smooth by polishing. On the other hand, polishing of the inner surface of the grooves 31 is impossible. When the conductor film 32 is formed on such a rough surface of the groove 31 by a plating process or the like, there is a substantial risk that small pinholes are formed on the conductor film 32 and such pinholes tend to cause the charge-up. As already noted, such a charge-up may cause an unwanted deformation or blur of the pattern that is written on the surface of the substrate.

SUMMARY OF THE INVENTION

Accordingly, it is a general object of the present invention to provide a novel and useful electron beam exposure system, wherein the foregoing problems are eliminated.

Another and more specific object of the present invention is to provide an electron beam exposure system, wherein the problem of charge-up of an electrostatic deflector used in the electron beam exposure system is eliminated, and wherein a uniform distribution of a potential and hence a uniform electric field is realized inside the electrostatic deflector simultaneously.

Another object of the present invention is to provide an electron beam exposure system for writing a pattern on an object by a focused electron beam, comprising: an electron beam source for producing an electron beam; focusing means for focusing said electron beam on said object; deflection means supplied with a control signal for deflecting the electron beam in response to the control signal, said deflection means comprising an electrostatic deflector; said electrostatic deflector comprising: a sleeve extending in an axial direction and having an outer surface and a corresponding inner surface; and a plurality of electrodes provided on said outer surface of said sleeve with a separation from each other in a circumferential direction of said cylindrical sleeve; said sleeve having a finite conductivity such that an electric current flows along said sleeve in said circumferential direction when a control voltage is applied across said plurality of electrodes. According to the present invention, the problem of charge-up of the electrostatic deflector is eliminated by using a conductive material for the cylindrical sleeve for supporting the electrodes. Thereby, the problem of deformation or blur of the electron beam on the surface of the object is eliminated. Further, by optimizing the conductivity of the cylindrical sleeve, one can realize a uniform distribution of the potential inside the sleeve when the control voltage is applied across the electrodes. It should be noted that the electric potential changes along the circumference of the sleeve and an electric current flows through the sleeve in the circumferential direction. As there is no conductor exposed at the inner surface of the sleeve, the problem of distortion of the electric field in the vicinity of the electrode as in the conventional case does not occur. Further, such a structure of the electrostatic deflector is easy to manufacture, as the electrodes can be formed easily on the outer surface of the sleeve.

Other objects and further features of the present invention will become apparent from the following detailed description when read in conjunction with the attached drawings.

DETAILED DESCRIPTION OF THE PREFERRED EMBODIMENTS

Figure 4:
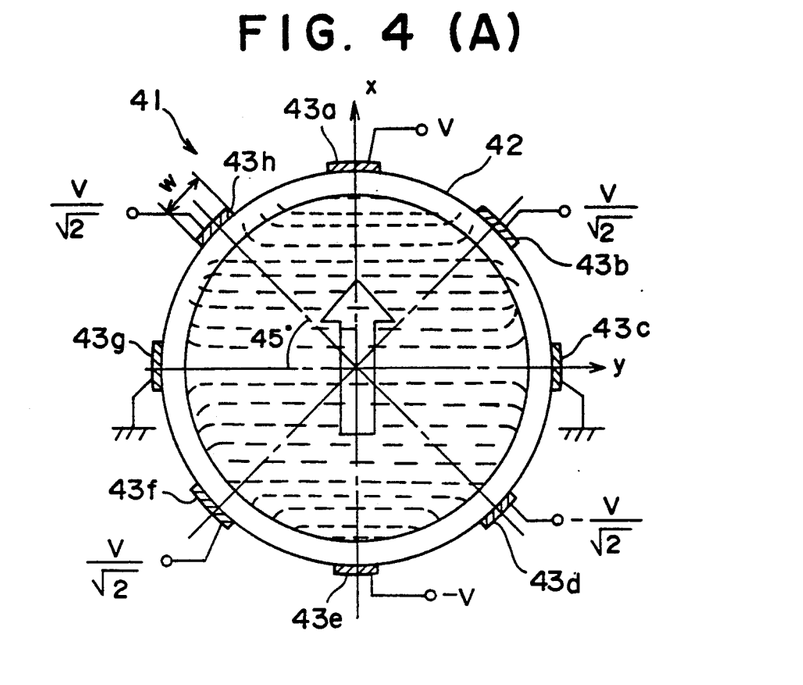
FIGS. 4(A) and 4(B) are diagrams showing the electrostatic deflector according to an embodiment of the present invention.

FIG. 4(A) shows the cross sectional view of an electrostatic deflector 41 according to an embodiment of the present invention.

Referring to FIG. 4(A), the electrostatic deflector 41 includes a cylindrical sleeve 42 of SiC having an inner diameter of 6–10 mm, depending on the type of the apparatus of the electron beam exposure system and the location where the electrostatic deflector is used. Typically, the sleeve 42 has a wall thickness of about 1 mm.

On the cylindrical outer surface of the sleeve 42, there are provided a number of strip-like electrodes 43a–43h to surround the sleeve with an equal separation in the circumferential direction. Each electrode extends in the axial direction of the sleeve as shown in the perspective view of FIG. 5. In a typical example, the electrode has a width w of about 1 mm in the circumferential direction and has a length L of about 30–50 mm in correspondence to the length of the sleeve 42.

In the illustrated example, the electrodes 43a–43h are made of metals such as a metallized Mo-Mn alloy, metallized Cu-Ti alloy, or plated Au, and are provided with an angular separation of 45° when viewed in the axial direction of the sleeve as shown in the cross sectional view of FIG. 4(A).

In operation, a positive voltage $+V$ and a negative voltage $-V$ are applied across a pair of mutually opposing electrodes 43a and 43e. On the other hand, an intermediate voltage $V_i$ that has a value intermediate between the voltage $+V$ and the voltage $-V$ is applied on the rest of the electrodes, wherein the voltage $V_i$ is determined according to the relationship $V_i = V \cdot \sin\theta$ similar to the conventional device. Thereby, the voltage that is applied to the mutually opposing electrodes 43c and 43g becomes zero, as these electrodes are disposed with an angle $\theta$ of 90 degrees. Thus, the electrodes 43c and 43g are connected to the ground as illustrated in FIG. 4(A). In response to the voltage V and $V_i$ applied as such, there is formed a distribution of the potential inside the sleeve 42 as indicated by broken lines in FIG. 4(A), and an electric field is formed in correspondence to the potential as indicated by an arrow.

Figure 4B:
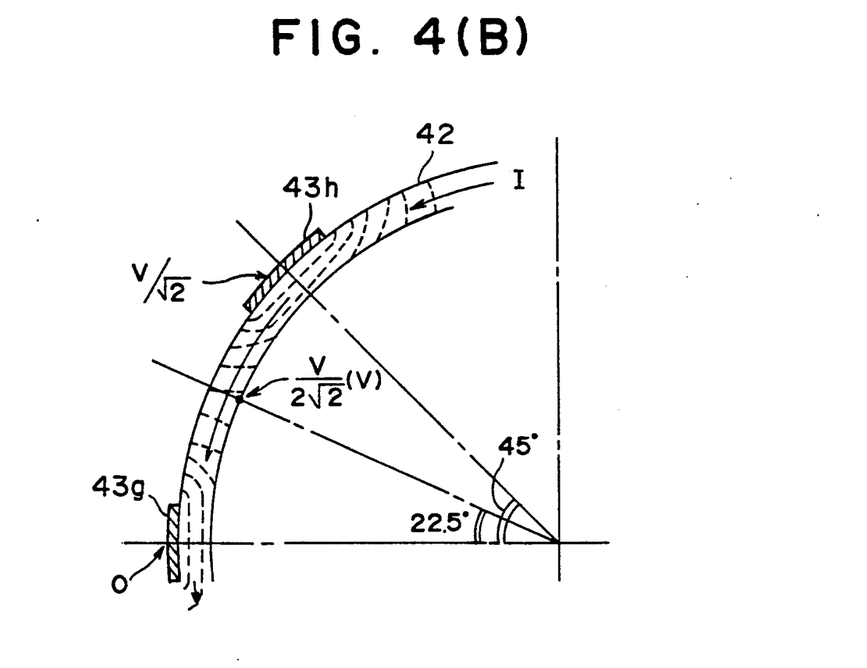

FIG. 4(B) shows a part of FIG. 4(A) in an enlarged scale together with the iso-potential surface that is formed in the sleeve 42 in response to the application of the voltage to the electrodes 43a–43h. As SiC is a semiconductor material, a current flows in the sleeve 42 in the circumferential direction when the electrodes 43a–43h are applied with the voltage as such. Typically, the SiC sleeve 42 has a resistivity of 1000 Ωcm to 10000 Ωcm. There, the potential at the inner surface of the sleeve 42 changes gradually also with the angle $\theta$, and the distribution of the potential inside the sleeve 42 becomes uniform as indicated in FIG. 4(A). As noted previously, there is no exposed electrode or conductor at the inner surface of the sleeve 42.

When the thickness of the sleeve 42 is increased, the distribution of the potential would become more uniform. On the other hand, the excessive increase of the thickness of the sleeve 42 results in an increased current in the sleeve 42 and hence a heating of the sleeve. When the temperature of the sleeve 42 is changed, the geometrical relationship between the electrodes is changed and the path of the electron beam will be changed unwantedly. In other words, there occurs a drift of the electron beam each time when the electrostatic deflector is activated. Thereby, one has to interrupt the exposure until the electron beam becomes stationary.

The problem of unwanted heating of the electrostatic deflector may be reduced by using a material having a large resistivity for the sleeve 42. However, the use of large resistivity material may deteriorate the problem of charge-up. Thus, in order to obtain an optimum result, it is necessary to optimize the dimension as well as the resistivity of the sleeve 42. Hereinafter, the optimization of design of the electrostatic deflector will be described with reference to FIGS. 6 and 7.

Figure 5:
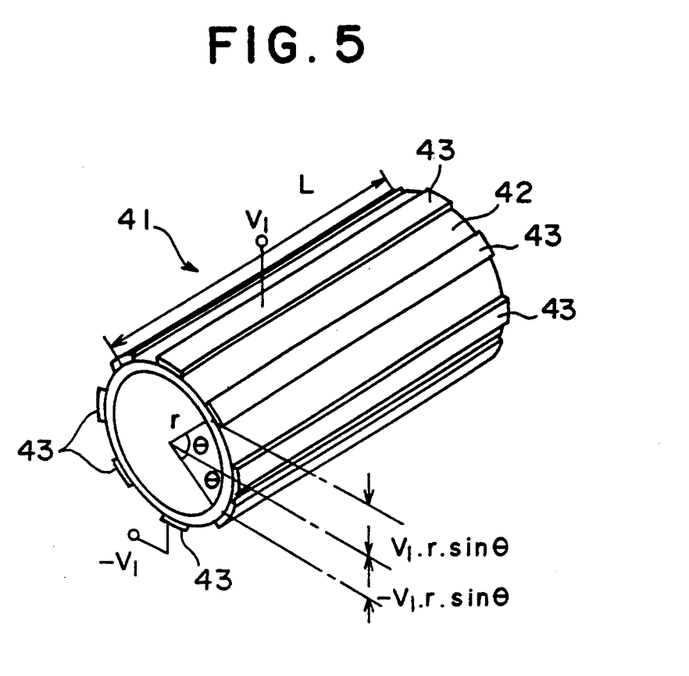
FIG. 5 is a diagram showing the electrostatic deflector of FIGS. 4(A) and 4(B) in a perspective view.
Figure 6:
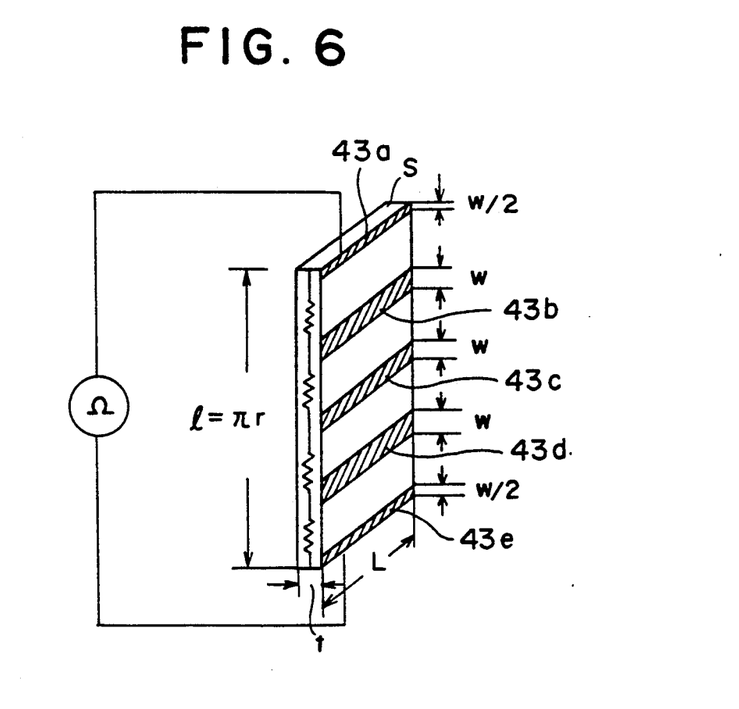
FIG. 6 is an equivalent circuit diagram of the electrostatic deflector of the present invention shown in FIGS. 4(A) and 4(B)

Referring to FIG. 6 showing the equivalent circuit diagram of the electrostatic deflector of FIG. 5, the sleeve 42 is split into two parts along a cross section that passes a pair of opposing electrodes such as the electrode 43a and the electrode 43e, wherein FIG. 6 shows only one of such a split part in a flattened state. It should be noted that the electrodes 43b–43d have the same width w, while the electrodes 43a and 43e have a width w/2 in correspondence to the aforementioned splitting of the sleeve 42.

In FIG. 6, the length l corresponding to one-half of the circumference of the sleeve 42 is represented as $l = \pi r$, where r represents the average of the inner diameter $r_1$ and the outer diameter $r_2$ of the sleeve 42. On the other hand, the thickness t is represented as $r_2 - r_1$ in correspondence to the difference between the outer diameter and the inner diameter. In FIG. 6, it will be noted that the electrodes extend for a length L in correspondence to the axial length of the sleeve 42.

Designating the resistivity of the material that forms the sleeve 42 as $\rho$, the total resistance R of the sleeve 42 is represented as a function of the parameters $r_1$, $r_2$, w and L as $$R = 1/2 \rho l/S$$
$$= [\{\pi(r_1 + r_2) - 8w\}/2(r_2 - r_1)] \lambda \rho$$

As already noted, the effect of charge-up can be minimized by reducing the resistivity $\rho$ as much as possible. On the other hand, the excessive reduction of the resistivity invites the heating of the sleeve by the current flowing in the circumferential direction of the sleeve according to the well known relationship $W = I^2 \cdot R$. When such a heating occurs, the sleeve 42 as well as the electrodes held thereon are deformed, and the problem of the drift of the electron beam occurs.

Figure 7:
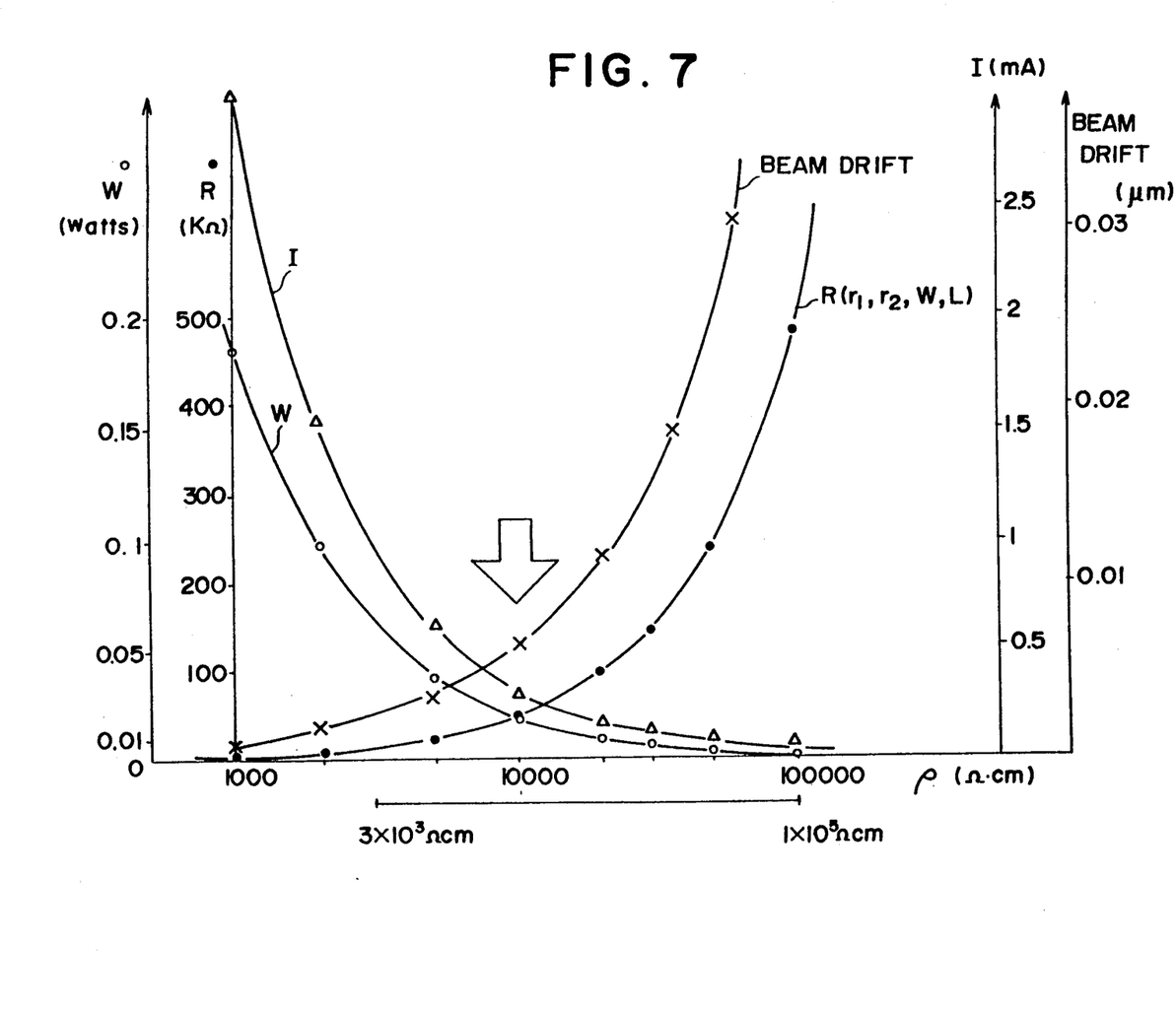
FIG. 7 is a diagram showing the optimization of design of the electrostatic deflector of the present invention.

FIG. 7 shows the relationship between the resistance R as well as the electrical power W that is consumed by the electrostatic deflector as a Joule heating. From this diagram, one can see that the drift of the electron beam can be minimized below 0.02 μm by setting the resistivity as indicated by an arrow in correspondence to the minimum of the resistance R and simultaneously in correspondence to the minimum of the power consumption W. This minimum, represented by the arrow of FIG. 7, changes of course depending on the design parameters of the electrostatic deflector such as $r_1$, $r_2$, w and L. Generally, a range between 1000 Ωcm and 100,000 Ωcm is preferred for the resistivity of the sleeve 42.

It should be noted that the technique for the formation of SiC products with a controlled resistivity is well established in the art and needs no further description. The cylindrical sleeve 42 itself may be formed by an extrusion process or injection molding. The SiC green body thus formed is sintered at a temperature of 1600–2200° C. Alternatively, one may use a bulk sintered SiC body and apply a machining process to form the sleeve 42 for example by the electric discharge machining process.

On the other hand, the electrodes 43 are provided by forming a conductor film by the matallizing the outer surface of the sleeve by the Mo-Mn or Cu-Ti alloy. Alternatively, the conductor film may be formed by the plating of Au. The conductor film thus formed is subsequently patterned by an etching process. As the electrodes are formed on the outer surface, one can form easily the electrodes with reduced width w. Alternatively, one can increase the number of electrodes without difficulty. Thereby, the distribution of the potential inside the sleeve 42 is improved further.

Apart from the Joule heating, there exists another reason to limit the current that flows through the sleeve 42 below about 1 mA. It should be noted that the amplifier that drives the electrostatic deflector of the present invention is required to produce not only the drive voltage but also a substantial drive current. When the necessary drive current becomes larger, the time needed for the output of the drive amplifier to settle becomes longer. Thereby, the response to the electrostatic deflector is inevitably deteriorated. In order to suppress the current below about 1 mA, it is necessary to set the resistivity of SiC to about several thousand ohm-centimeters or more.

Figure 8:
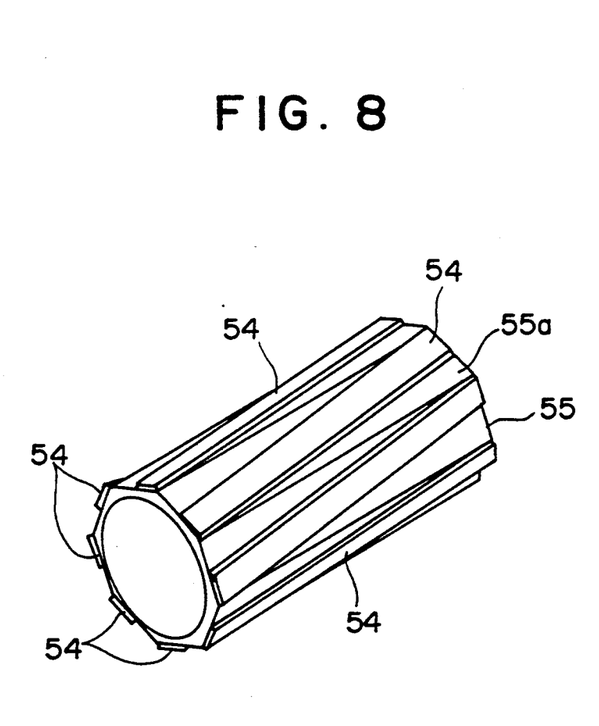
FIG. 8 is a diagram showing the electrostatic deflector according to another embodiment of the present invention.

FIG. 8 shows a second embodiment of the present invention.

Referring to FIG. 8, the electrostatic deflector of the present embodiment includes a sleeve 55 of SiC wherein the sleeve 55 has a cylindrical inner surface and a polygonal outer surface. There, the polygonal outer surface is formed from a number of flat surfaces 55a that extends in the axial direction of the sleeve 55. On each outer surface 55a, there is provided a strip-like electrode 54 such that the electrode 54 extends diagonally on the surface 55a. By providing the electrodes of the electrostatic deflector obliquely with the axis, the electric potential formed inside the sleeve 55 changes in accordance with the spiral path of the electron beam. Thereby, an ideal control is achieved for deflecting the electron beam.

Further, the present invention is not limited to the embodiments described heretofore, but various variations and modifications may be made without departing from the scope of the invention.

What is claimed is:

1. An electron beam exposure system for writing a pattern on an object by a focused electron beam, comprising:
   an electron beam source for producing an electron beam;
   focusing means for focusing said electron beam on said object;
   deflection means supplied with a control signal for deflecting the electron beam in response to the control signal, said deflection means comprising an electrostatic deflector;
   said electrostatic deflector comprising:
   a sleeve extending in an axial direction and having an outer surface and a corresponding inner surface; and
   a plurality of electrodes provided on said outer surface of said sleeve with a separation from each other in a circumferential direction of said cylindrical sleeve;
   said sleeve having a finite conductivity such that an electric current flows along said sleeve in said circumferential direction when a control voltage is applied across said plurality of electrodes.

2. An electron beam exposure system as claimed in claim 1 in which said sleeve has a resistivity in a range between 1000 $\Omega$cm and 100,000 $\Omega$cm.

3. An electron beam exposure system as claimed in claim 1 in which said sleeve comprises a sintered body of SiC sintered at a temperature between 1600–2200° C. and machined subsequently.

4. An electron beam exposure system as claimed in claim 1 in which said sleeve comprises a sintered body of SiC formed by sintering a green body that is shaped to have a form of said sleeve, at a temperature between 1600–2200° C.

5. An electron beam exposure system as claimed in claim 1 in which said electrodes are formed by covering said outer surface of said sleeve by a film of a conductor.

6. An electron beam exposure system as claimed in claim 5 in which said conductor is selected from a group essentially consisting of a Mo-Mn alloy, a Cu-Ti alloy, and Au.

7. An electron beam exposure system as claimed in claim 1 in which said sleeve has a cylindrical form, and said electrodes extend in said axial direction of said sleeve.

8. An electron beam exposure system as claimed in claim 1 in which said electrodes extend obliquely with respect to said axial direction of said sleeve.

9. An electron beam exposure system as claimed in claim 8 in which said outer surface of said sleeve has a polygonal shape when viewed in said axial direction and has a plurality of flat surfaces extending in said axial direction, wherein said electrode extends diagonally on said flat surface.

10. A method for deflecting an electron beam, comprising the steps of:
   applying a voltage on a plurality of electrodes provided on an outer surface of a sleeve, said sleeve extending in an axial direction and being formed with a passage of the electron beam that extends also in said axial direction, said sleeve comprising a material having a finite conductivity,
   said step of applying the voltage comprising a step of causing to flow a current through said sleeve in a circumferential direction to establish a potential inside said passage such that said potential is characterized by substantially planar iso-potential surfaces that extend generally parallel with each other and such that there is formed a uniform electric field acting in a predetermined direction; and
   passing said electron beam through said passage.

* * * * *